(12) United States Patent
Reinberg

(10) Patent No.: US 6,548,872 B2
(45) Date of Patent: Apr. 15, 2003

(54) INTEGRATED CIRCUITRY COMPRISING MULTIPLE TRANSISTORS WITH DIFFERENT CHANNEL LENGTHS

(75) Inventor: Alan R. Reinberg, Westport, CT (US)

(73) Assignee: Micron Technology, Inc., Boise, ID (US)

( * ) Notice: Subject to any disclaimer, the term of this patent is extended or adjusted under 35 U.S.C. 154(b) by 15 days.

(21) Appl. No.: 09/894,195

(22) Filed: Jun. 27, 2001

(65) Prior Publication Data

US 2001/0046741 A1 Nov. 29, 2001

Related U.S. Application Data

(62) Division of application No. 09/579,281, filed on May 24, 2000, now Pat. No. 6,300,199.

(51) Int. Cl.[7] .......................... H01L 29/76; H01L 29/94; H01L 31/062; H01L 31/113; H01L 31/119
(52) U.S. Cl. .................... 257/368; 257/135; 257/288; 257/330
(58) Field of Search ........................... 257/135, 302, 257/328, 330–332, 334, 392, 369, 371, 288, 315, 368; 438/268, 147, 209, 206, 242, 259, 270, 275, 283, 578, 640, 146, 156, 157, 163, 173, 192, 212, 213, 271, 282, 669, 673, 585, 138, 269, 142, 197

(56) References Cited

U.S. PATENT DOCUMENTS

| | | |
|---|---|---|
| 3,761,785 A | 9/1973 | Pruniaux |
| 5,945,705 A * | 8/1999 | Liu et al. .................. 257/315 |
| 6,027,975 A | 2/2000 | Hergenrother et al. |
| 6,043,122 A | 3/2000 | Liu et al. |
| 6,232,229 B1 | 5/2000 | Reinberg |

FOREIGN PATENT DOCUMENTS

JP          10294386 A   * 11/1998  ....... H01L/21/8246

OTHER PUBLICATIONS

Hergenrother, J.M., Et Al. "The Vertical Replacement–Gate (VRG) MOSFET: A 50–nm Vertical MOSFET With Lithography–Independent Gate Lenght", *I.E.E.E.*, 4 pages (Mar., 1999).

* cited by examiner

*Primary Examiner*—Matthew Smith
*Assistant Examiner*—Craig P. Lytle
(74) *Attorney, Agent, or Firm*—Wells St. John P.S.

(57) ABSTRACT

A method of defining at least two different field effect transistor channel lengths includes forming a channel defining layer over a substrate, the semiconductor substrate having a mean global outer surface extending along a plane. First and second openings are etched into the channel defining layer. The first and second openings respectively have a pair of opposing sidewalls having substantially straight linear segments which are angled from the plane. The straight linear segments of the opposing sidewalls of the first opening are angled differently from the plane than the straight linear segments of the opposing sidewalls of the second opening and are thereby of different lengths. Integrated circuitry includes a first field effect transistor and a second field effect transistor. The first and second field effect transistors have respective channel lengths defined along their gate dielectric layers and respectively have at least some portion which is substantially straight linear. The first and second channel lengths have different total lengths, both of the straight linear portions of the first and second channel lengths are angled from the plane, and at least one of the straight linear portions of the first and second channel lengths are beveled relative to the plane.

16 Claims, 7 Drawing Sheets

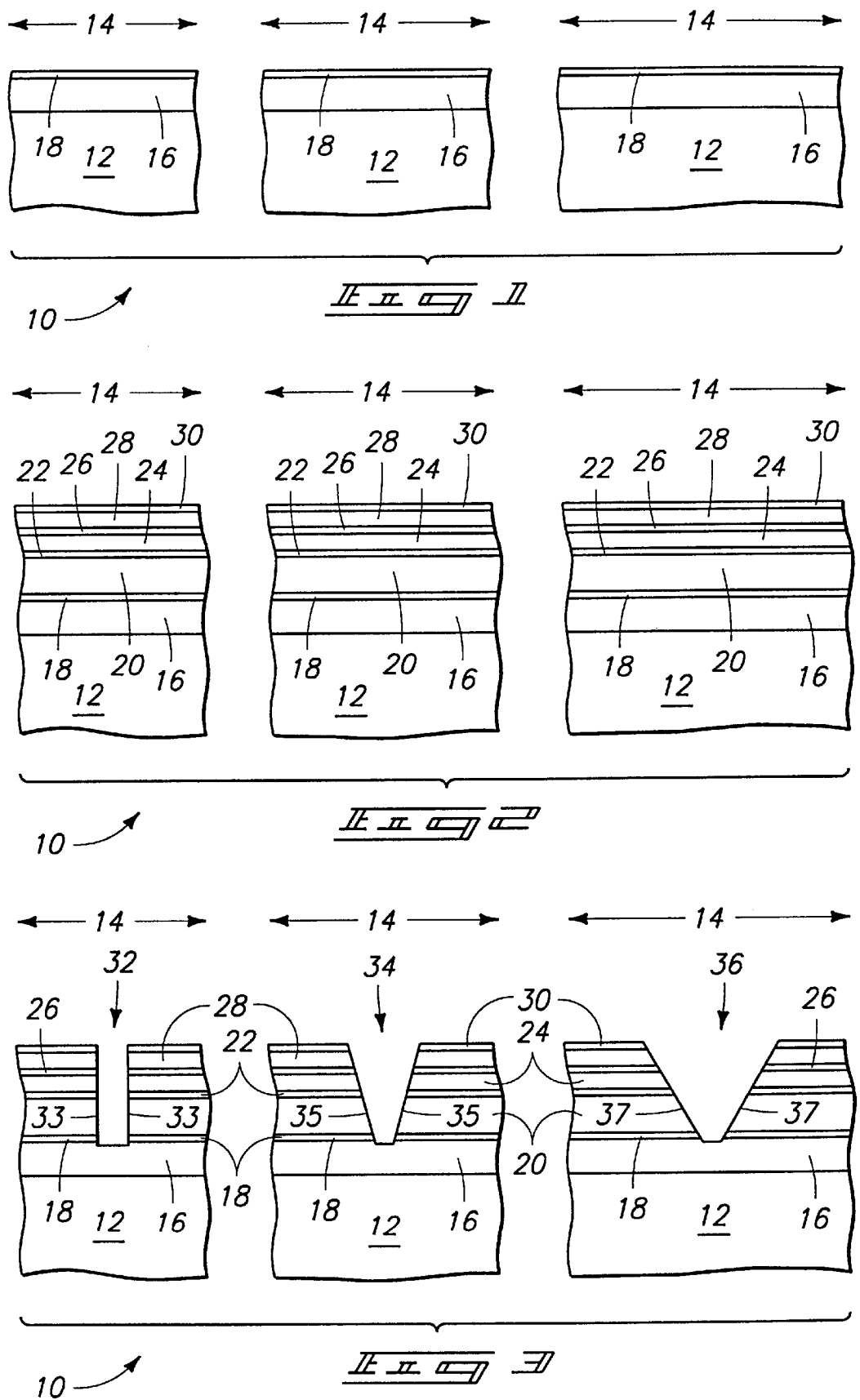

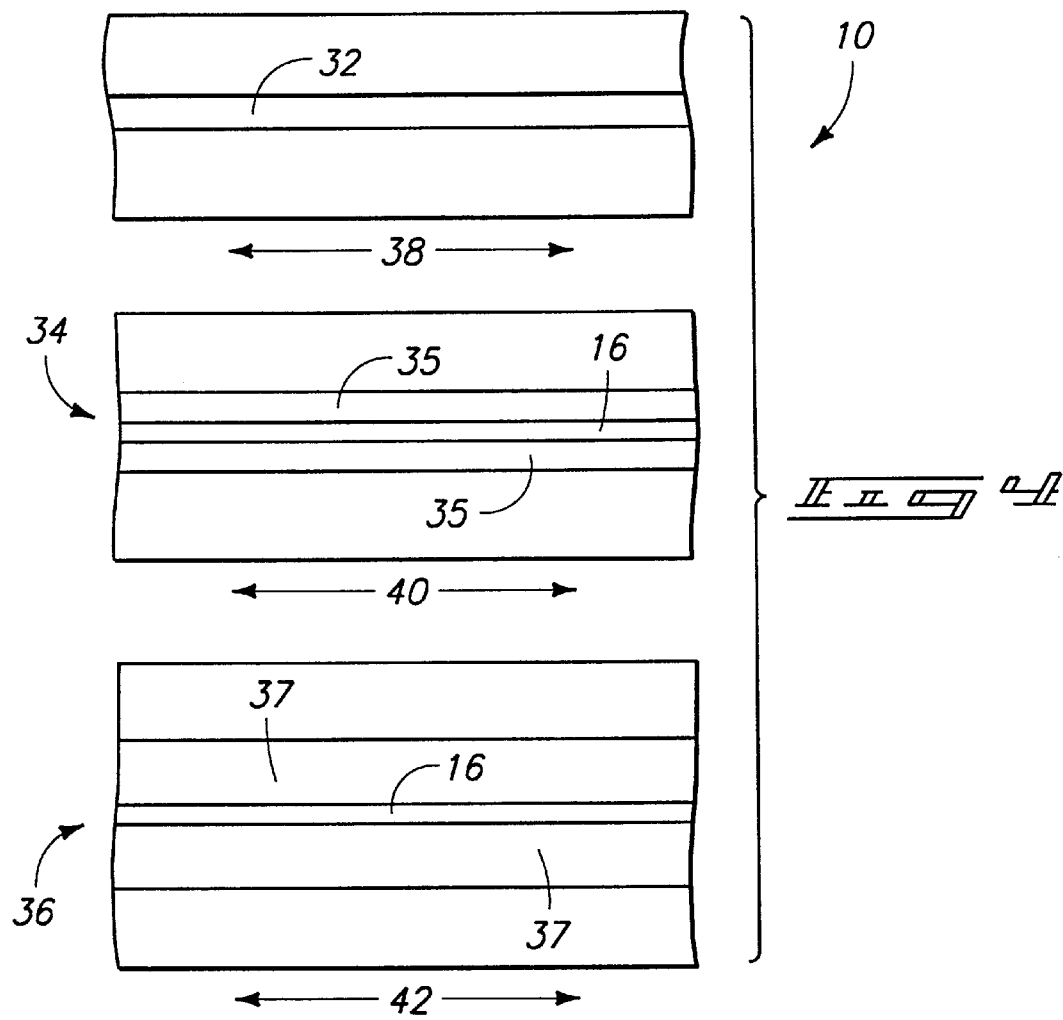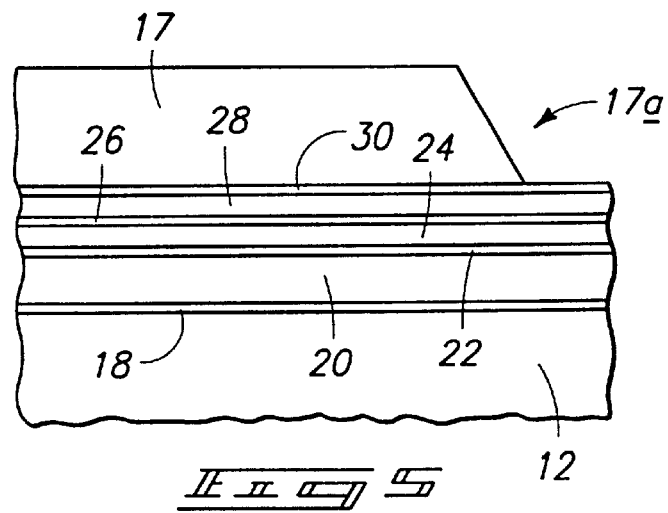

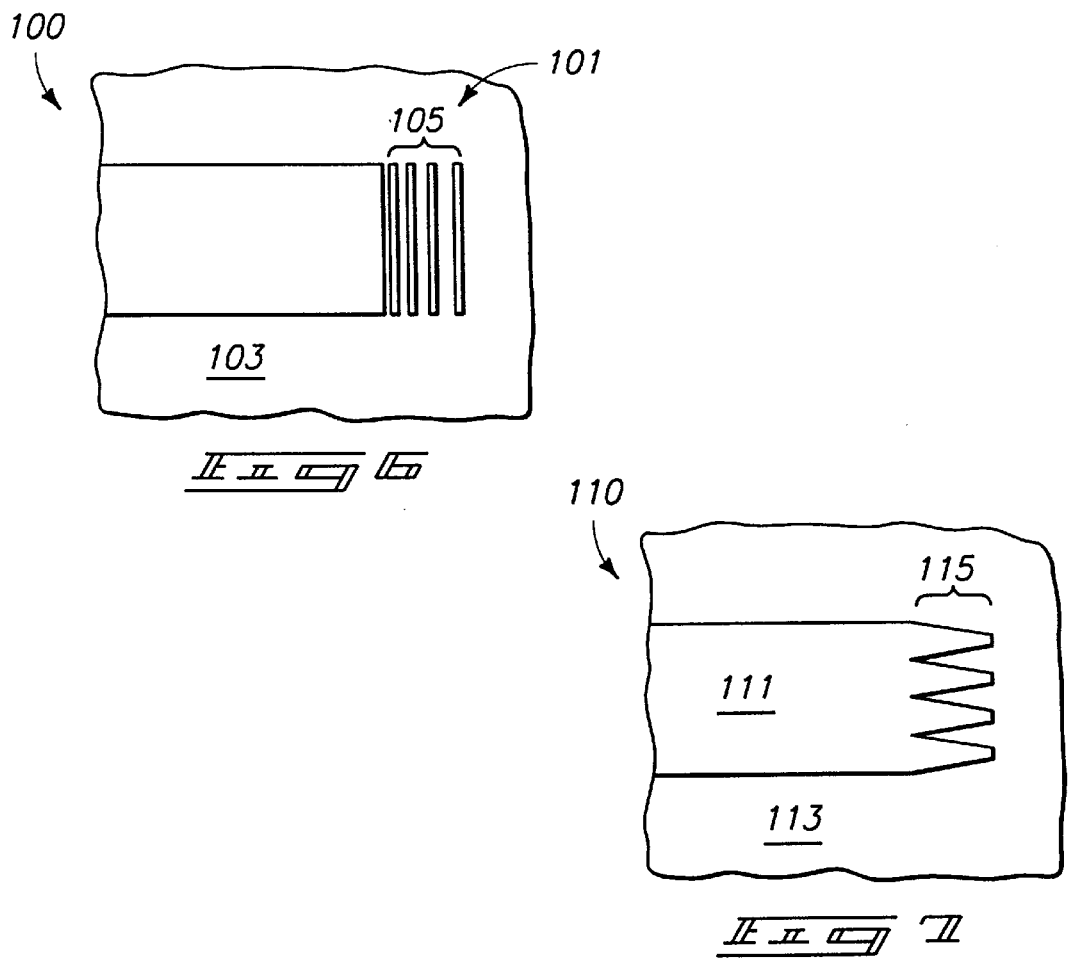
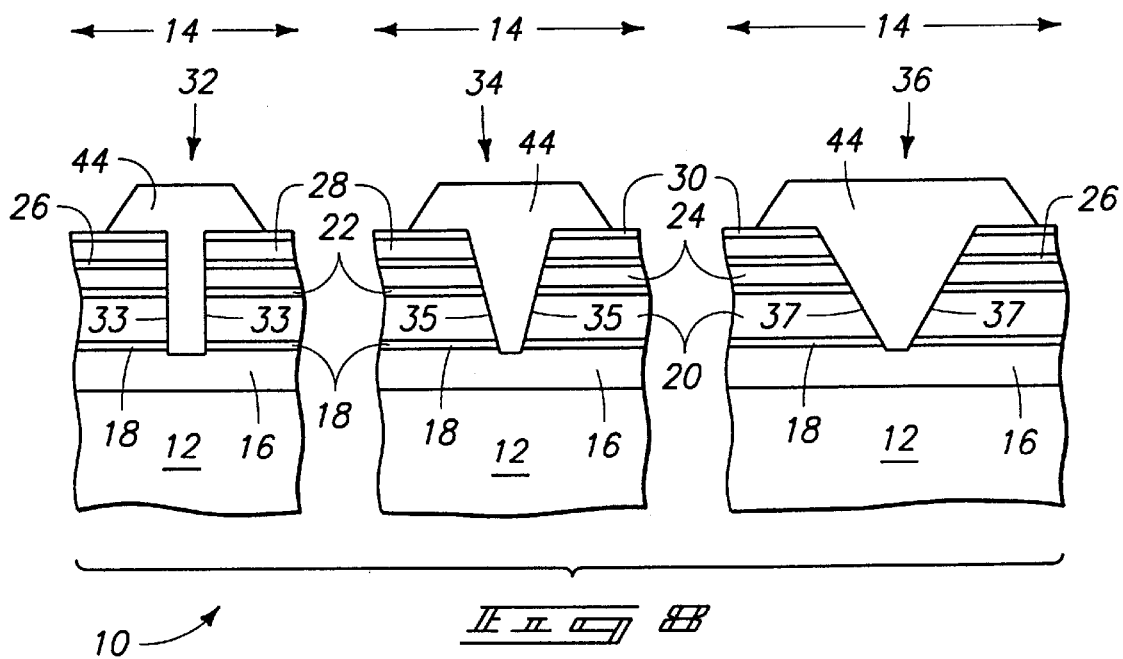

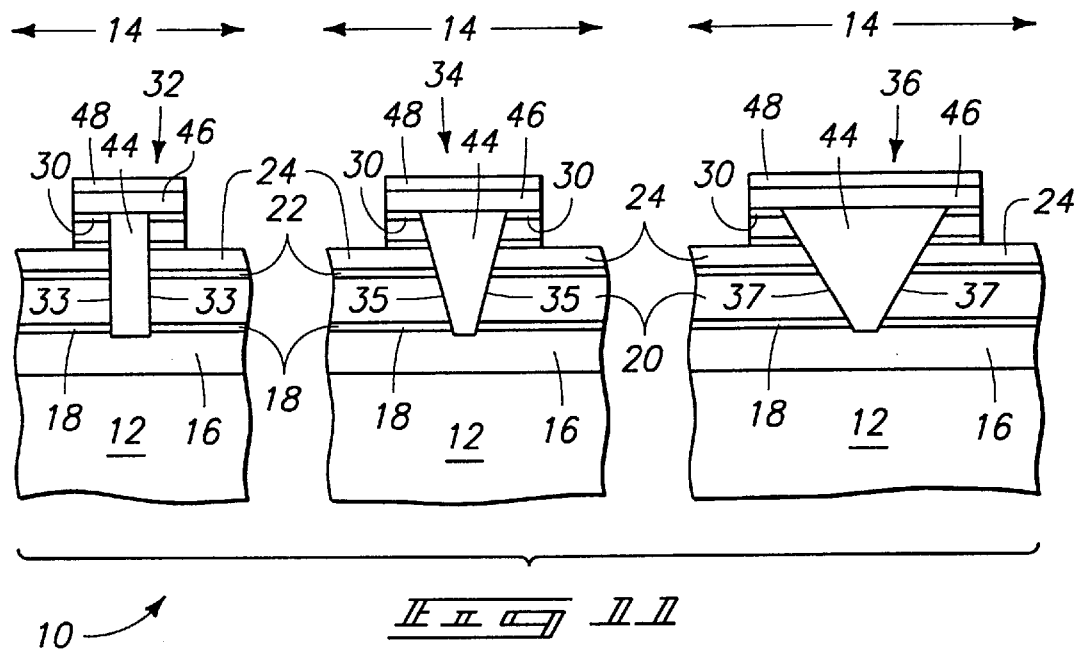
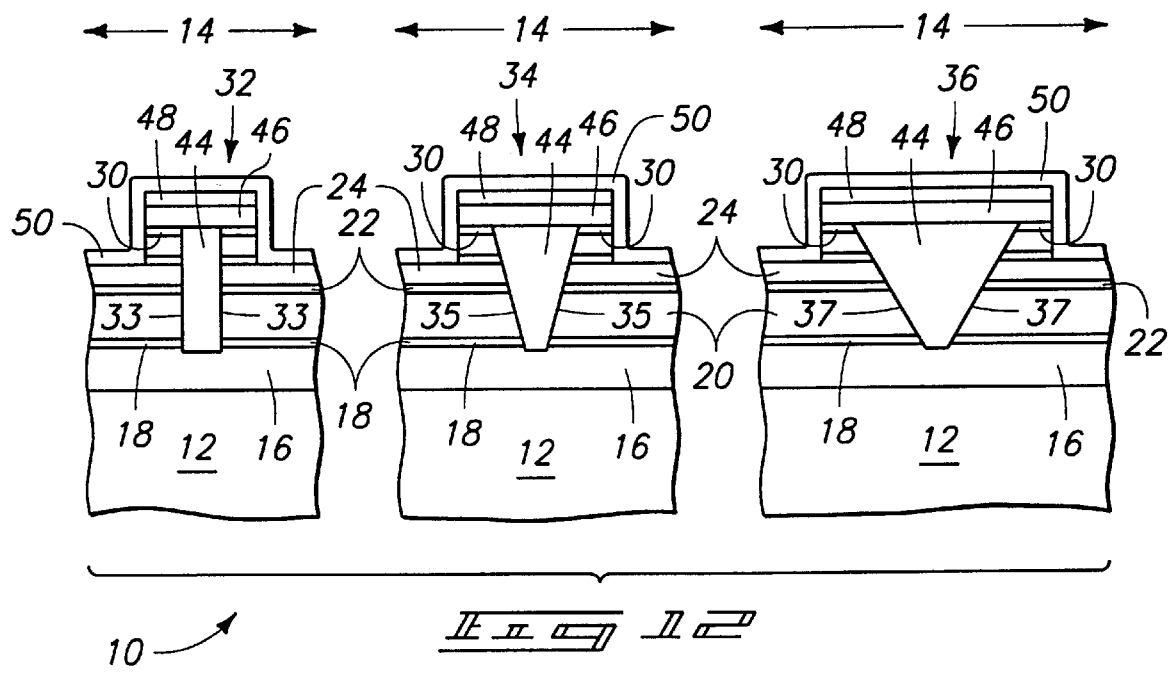

ND CIRCUITRY COMPRISING
MULTIPLE TRANSISTORS WITH
DIFFERENT CHANNEL LENGTHS

RELATED PATENT DATA

This patent resulted from a divisional application of U.S. patent Ser. No. 09/579,281, filed Apr. 24, 2000, entitled "Method of Defining at Least Two Different Field Effect Transistor Channel Lengths Using Differently Angled Sidewall Segments of a Channel Defining Layer", naming Alan R. Reinberg as inventor, the disclosure of which is incorporated by reference and U.S. Pat. No. 6,300,199.

TECHNICAL FIELD

This invention relates to methods of defining at least two different field effect transistor channel lengths, to methods of forming a pair of field effect transistor channels having different channel lengths, to methods of forming a pair of field effect transistors having different channel lengths, and to integrated circuitry.

BACKGROUND OF THE INVENTION

Integrated circuitry fabrication typically involves lithographic processing whereby a desired circuitry image is formed in an imaging layer. The image is transferred to underlying circuitry layers on a substrate by using the imaging layer as a mask during etching or other removal of underlying material exposed through the imaging layer. Further, in many instances it is desirable to form the same type of devices from a commonly deposited conductive layer to have different dimensions, including having different base widths of such devices.

Integrated circuitry fabricators are ever attempting to increase circuitry density and thereby reduce the size of individual conductive components. As device dimensions decrease, interest is increasing in using alternatives to lithographic definition of features, particularly in an effort to achieve device dimensions that are smaller than the available, yet ever decreasing, minimum feature resolution using lithography.

Various vertical device structures are under investigations that make use of controlled deposition as a means of creating small features, with the base width dimension thereby being controlled largely by the deposition thickness of the layer. For example, it is possible to deposit conductive material over a vertical wall to a known desired thickness, and then remove it from horizontal surfaces by anisotropic reactive ion etching. This leaves a vertically extending conductive component having a base width essentially equal to the deposition thickness of the conductive layer. Such techniques have historically also been utilized to form insulative spacers over field effect transistor lines.

Further, in many instances it is desirable to form field effect transistors from commonly deposited conductive layers which have different designed channel lengths.

One way of accurately defining a single field effect transistor channel length is with respect to the deposition thickness of the channel layer itself which, if desired, can be sublithographic. One example of such processing in a device is described by Hergenrother et al. in an article entitled "The Vertical Replacement-Gate (VRG) MOSFET: A 50-nm Vertical MOSFET with Lithography-Independent Gate Length", of Bell Laboratories/Lucent Technologies. A copy of this document is submitted with an Information Disclosure accompanying the application which became this patent. Such discloses defining channel length by deposition of a channel defining layer through which an opening is etched, with the opening having opposing substantially vertical sidewalls. Semiconductive channel material then fills the opening. The channel defining layer is later removed and replaced with gate dielectric material and conductive gate material.

It would be desirable to improve upon this and other methods where channel defining layers are utilized for establishing gate length in field effect transistors.

SUMMARY

The invention includes methods of defining at least two different field effect transistor channel lengths, to methods of forming a pair of field effect transistor channels having different channel lengths, to methods of forming a pair of field effect transistors having different channel lengths, and to integrated circuitry. In one implementation a method of defining at least two different field effect transistor channel lengths includes forming a channel defining layer over a substrate, the semiconductor substrate having a mean global outer surface extending along a plane. First and second openings are etched into the channel defining layer. The first and second openings respectively have a pair of opposing sidewalls having substantially straight linear segments which are angled from the plane. The straight linear segments of the opposing sidewalls of the first opening are angled differently from the plane than the straight linear segments of the opposing sidewalls of the second opening and are thereby of different lengths.

In one implementation, integrated circuitry includes a substrate having a mean global outer surface extending along a plane. A first field effect transistor has a first gate, a first gate dielectric layer, a first channel, and a pair of source/drain regions. One of the first transistor source/drain regions is received elevationally inward of the first channel, the other elevationally outward. The first field effect transistor has a first channel length defined along the first gate dielectric layer and has at least some portion which is substantially straight linear. A second field effect transistor has a second gate, a second gate dielectric layer, a second channel, and a pair of source/drain regions. One of the second transistor source/drain regions is received elevationally inward of the second channel, the other elevationally outward. The second field effect transistor has a second channel length defined along the second gate dielectric layer and has at least some portion which is substantially straight linear. The first and second channel lengths have different total lengths, both of the straight linear portions of the first and second channel lengths are angled from the plane, and at least one of the straight linear portions of the first and second channel lengths are beveled relative to the plane.

BRIEF DESCRIPTION OF THE DRAWINGS

Preferred embodiments of the invention are described below with reference to the following accompanying drawings.

FIG. 1 is a diagrammatic fragmentary sectional view of portions of a semiconductor wafer fragment in process in accordance with aspects of the invention.

FIG. 2 is a view of the FIG. 1 wafer fragment at a processing step subsequent to that depicted by FIG. 1.

FIG. 3 is a view of the FIG. 1 wafer fragment at a processing step subsequent to that depicted by FIG. 2.

FIG. 4 is a diagrammatic top plan view of the FIG. 3 wafer fragment.

FIG. 5 is a diagrammatic sectional view of a precursor construction to the far right fragmentary portion of FIG. 3.

FIGS. 6 and 7 are diagrammatic top views of exemplary exposure masks usable to form the FIG. 5 construction.

FIG. 8 is a view of the FIG. 1 wafer fragment at a processing step subsequent to that depicted by FIG. 3.

FIG. 11 is a view of the FIG. 1 wafer fragment at a processing step subsequent to that depicted by FIG. 10.

FIG. 12 is a view of the FIG. 1 wafer fragment at a processing step subsequent to that depicted by FIG. 11.

DETAILED DESCRIPTION OF THE PREFERRED EMBODIMENTS

Figure 9:
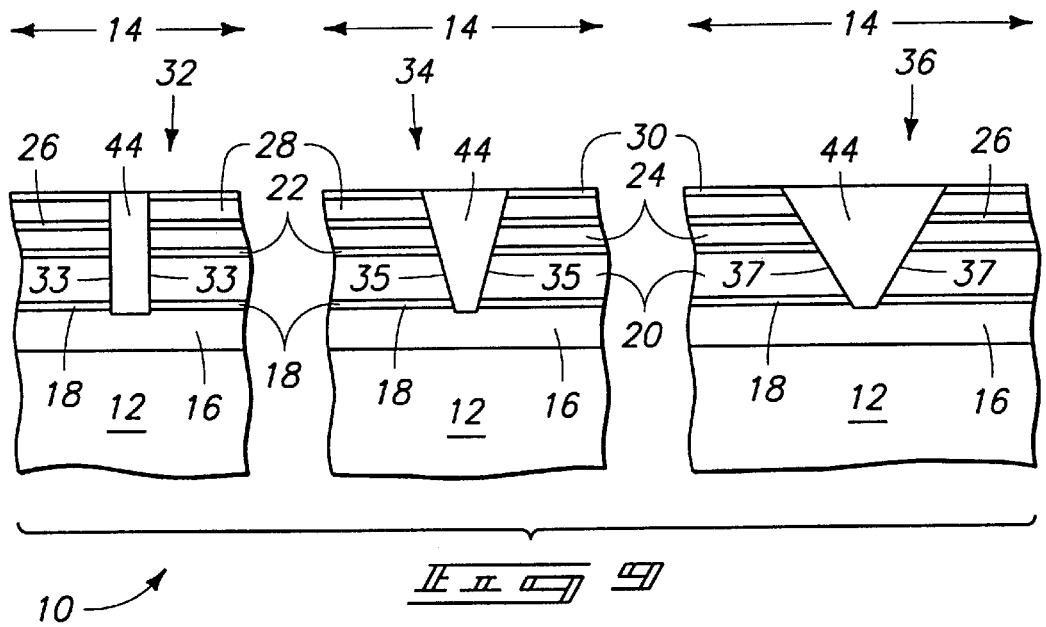
FIG. 9 is a view of the FIG. 1 wafer fragment at a processing step subsequent to that depicted by FIG. 8.

This disclosure of the invention is submitted in furtherance of the constitutional purposes of the U.S. Patent Laws "to promote the progress of science and useful arts" (Article 1, Section 8).

But one preferred embodiment of the invention is described relative to an implementation in accordance with the above-referenced Hergenrother et al. method and device. However, the invention is in no way so limited, with the invention only being limited by the accompanying claims appropriately interpreted in accordance with the doctrine of equivalents.

Referring initially to FIG. 1, a semiconductor wafer fragment in process is indicated generally with reference numeral 10. In the context of this document, the term "semiconductor substrate" or "semiconductive substrate" is defined to mean any construction comprising semiconductive material, including, but not limited to, bulk semiconductive materials such as a semiconductive wafer (either alone or in assemblies comprising other materials thereon), and semiconductive material layers (either alone or in assemblies comprising other materials). The term "substrate" refers to any supporting structure, including, but not limited to, the semiconductive substrates described above. Further in the context of this document, the term "layer" encompasses both the singular and the plural.

The discussion proceeds with a description of a method of defining at least two different field effect transistor channel lengths, in conjunction with fabrication of least two field effect transistors having different channel lengths, and in conjunction with resultant integrated circuitry having two field effect transistors independent of the method of fabrication.

Wafer fragments 10 comprise a bulk monocrystalline silicon substrate 12. Substrate 10 comprises a mean global outer surface extending along a plane 14. The micro-level topography of an outer surface of substrate 10 might be substantially non-planar. Nevertheless, the substrate can be considered as having some mean global outer surface extending along a plane 14 in considering the general expanse across the wafer or a resultant integrated circuitry chip. A suitable conductivity enhancing implant is fabricated into silicon wafer 12 to form source/drain diffusion regions 16 for part of the respective transistors. Arsenic is but one example. A thin oxide diffusion barrier layer 18 is deposited or grown thereover, with an example thickness being 30 nanometers.

Referring to FIG. 2, and in accordance with the Hergenrother et al. method and device and by way of example only, a phosphosilicate glass layer 20, a nitride layer 22, an undoped oxide layer 24, a nitride layer 26, a phosphosilicate glass layer 28, and a silicon nitride layer 30 are deposited or otherwise formed over the substrate. By way of example only, exemplary thickness for each include 150 nanometers, 25 nanometers, 70 nanometers, 25 nanometers, 70 nanometers, and 70 nanometers, respectively. Undoped oxide layer 24, in accordance with an aspect of the invention, constitutes a channel defining layer which is formed over semiconductor substrate 12, and whose deposition thickness is precisely controlled as impacting the ultimate channel lengths of the respective transistors being defined, as will be appreciated by the accompanying description. The channel defining layer might comprise any of a number of materials, whether doped or undoped, electrically insulative, semiconductive or conductive, with the subject undoped oxide being only but one example.

Referring to FIGS. 3 and 4, first, second and third openings 32, 34 and 36 are etched into layers 18–30 and, accordingly, at least into channel defining layer 24. Such first, second and third openings can be considered as having a pair of opposing sidewalls 33, 35 and 37, respectively. Each of such sidewalls, as depicted, will have some substantially straight linear segment which is angled from plane 14, with the substantially straight linear segments of the opposing sidewalls of at least one of the openings being angled differently from plane 14 than the straight linear segments of the opposing sidewalls of another opening, and thereby being of different lengths. In the exemplary depicted embodiment, three different openings and angles are shown. The left illustrated opening of FIG. 3 is shown to have straight linear segments of sidewall 33 which are perpendicular to plane 14. The middle depicted portion of FIG. 3 shows straight linear segments of sidewalls 35 to be angled at 75° relative to plane 14. Straight linear segments of sidewalls 37 in the far right illustrated portion of FIG. 3 are shown as being angled at 60° relative to plane 14. Further in the illustrated embodiments, the entirety of the sidewalls of the respective openings are shown to be substantially straight linear from where the openings join with diffusion region 16 to an outermost surface of silicon nitride layer 30. The invention, of course, contemplates less than an entirety of such sidewalls being substantially straight linear between the exemplary depicted surfaces, but having at least some portion which can be considered substantially straight linear. In the context of this patent, "substantially straight linear" means a perfectly straight segment as well as a segment that has a degree of curvature associated with it. A curved segment is to be considered "substantially straight linear" in the context of this patent provided that it has some chord length greater than or equal to 30 nanometers and has some radius of curvature of at least 20 nanometers.

FIG. 4 depicts a top view of FIG. 3 and illustrates the exemplary openings 32, 34 and 36 being elongated in respective directions 38, 40 and 42, which are both parallel with plane 14 and with each other. Alternately by way of example only, such openings might be formed to be substantially enclosed in the form of a circle, ellipse, square or other shape, such that a resultant gate would be formed to surround therearound.

Considering openings 34 and 36 together, the straight linear segments of opposing sidewalls 35 of opening 34 and the straight linear segments of opposing sidewalls 37 are both bevelled relative to plane 14. Considering, for example, openings 32 and 34, only one pair of the pair of opposing sidewalls (namely, sidewalls 35) of opening 32 and opening 34 has straight linear segments which are bevelled relative to plane 14.

Most preferably, the etching of the illustrated openings 32, 34 and 36 occurs in a single common masking step. Further, such etching of all of such openings preferably occurs during the same etching step or steps, and most preferably occurs in the simultaneous formation of openings 32, 34 and 36. Producing the sidewall profiles illustrated in FIG. 3 might be created in a number of different manners. One specific example would include conducting a series of varying degree anisotropic etches, with the left illustrated view of the portion of the wafer fragment of FIG. 3 illustrating the greatest anisotropy of the three, and the right illustrated view depicting the least degree of anisotropy in the etch(es) of the three. However, this will most likely require utilization of separate maskings and etchings, and thereby add significantly to process complexity and time.

A more preferred process, in accordance with but one aspect of the invention, comprises forming a mask outwardly of the channel defining layer. The mask will, at some location, have a sloped resist sidewall corresponding to the depicted slopes of the sidewall segments of the respective FIG. 3 openings 32, 34 and 36. Etching is then conducted of the resist and channel defining layer (and in the depicted embodiment all such depicted layers) to form the respective pairs of opposing sidewalls of the openings to have straight linear segments which are bevelled relative to plane 14 for openings 34 and 36, and substantially not bevelled as shown with respect to opening 32. An example and preferred processing for accomplishing the same is disclosed in U.S. patent application Ser. No. 09/444,280, filed on Nov. 19, 1999, entitled "Microelectronic Device Fabricating Method, Integrated Circuit, and Intermediate Construction", listing Alan R. Reinberg as the inventor, and which is fully incorporated herein by reference.

For example, FIG. 5 depicts the far right portion of the wafer fragment of FIG. 3 at a processing step just prior to that of FIG. 3. Such shows layer 18–30 from which opening 36 of FIG. 3 will be made. A photoresist layer 17 overlies layer 30, and has a beveled edge 17a substantially equal to what will be the bevel angle of sidewalls 37 of opening 36. Such resist pattern is thereafter transferred by etching to form opening 36 of FIG. 3 from layers 18–30. Transfer of such a resist profile to an underlying substrate may be performed according to any a suitable method known to those skilled in the art at present or later developed. In one such method, transferring the profile of resist mask pattern 17 to materials 18–30 can be accomplished by etch processes that etch both resist 17 and the underlying material being etched. Reactive ion etch processes are capable of such etching. If resist mask pattern 17 and respective materials 18–30 are etched at approximately the same rates, then the profile produced in materials 18–30 will substantially match the profile of resist mask pattern 17, producing the far right FIG. 3 construction. As etch selectivity to materials 18–30 increases, the effectiveness of the profile transfer tends to decrease. If an etch affects materials 18–30 largely exclusively relative to resist 17, then it is unlikely that beveled portion 17a of resist mask pattern 17 will transfer to material 15. Transfer of a resist bevel to an underlying layer can be described by the expression: tan(resist bevel)/tan (substrate bevel)=etch rate$_{resist}$/etch rate$_{substrate}$.

FIG. 6 illustrates an exposure mask 100 including a blocking shape 101 positioned within a transparent region 103. Blocking shape 101 includes a graded portion 105 for exposing a resist to actinic energy providing gradated exposure. That is, graded portion 105 includes alternating blocking shapes and transparent regions spaced and otherwise positioned such that exposure intensity is increased at an edge of blocking shape 101 compared to the center of blocking shape 101. The advantage of blocking shape 101 is that exposure intensity to actinic radiation may be gradually increased over a desired distance such that gradated exposure of a resist region occurs.

FIG. 7 illustrates an exposure mask 110. Wafer portion 110 similarly includes blocking shape 111 positioned within a transparent region 113 and having a graded portion 115. Although different in structure from graded portion 105, graded portion 115 provides similar advantages. Alternatively, an otherwise solid blocking shape (not shown) could include openings formed therein of a designated size and positioned to accomplish similar advantages. A variety of other structures, devices, and exposure methods may be used to provide gradated exposure of a resist to actinic energy, whether currently known to those skilled in the art or later developed.

Referring to FIG. 8, semiconductive channel material 44 is formed within openings 32, 34 and 36, and which will have differing channel lengths defined at least along straight linear segments of sidewalls 33, 35 and 37, respectively. Accordingly, in the depicted and preferred embodiments, the channel length of sidewall 37 is greater than the channel lengths of each of 35 and 33 due to the sequentially increasing of the angle from plane 14. The channel lengths, "L", can be approximated by the equation L=t/sin a, where, for example, the substantially straight linear segments extend from the outer surface of layer 30 to diffusion region 16, "a" is the angle from plane 14, and "t" is the thickness of layer 30. Some rounding might, of course, occur towards the bottom of the respective openings. The semiconductive material 44 can comprise, by way of example only, conductively doped epitaxial silicon, for example, being boron-doped. Epitaxial silicon growth can be somewhat selective, as shown.

Referring to FIG. 9, semiconductive channel material 44 is planarized back, for example, by chemical-mechanical polishing, preferably stopping at silicon nitride layer 30.

Figure 10:
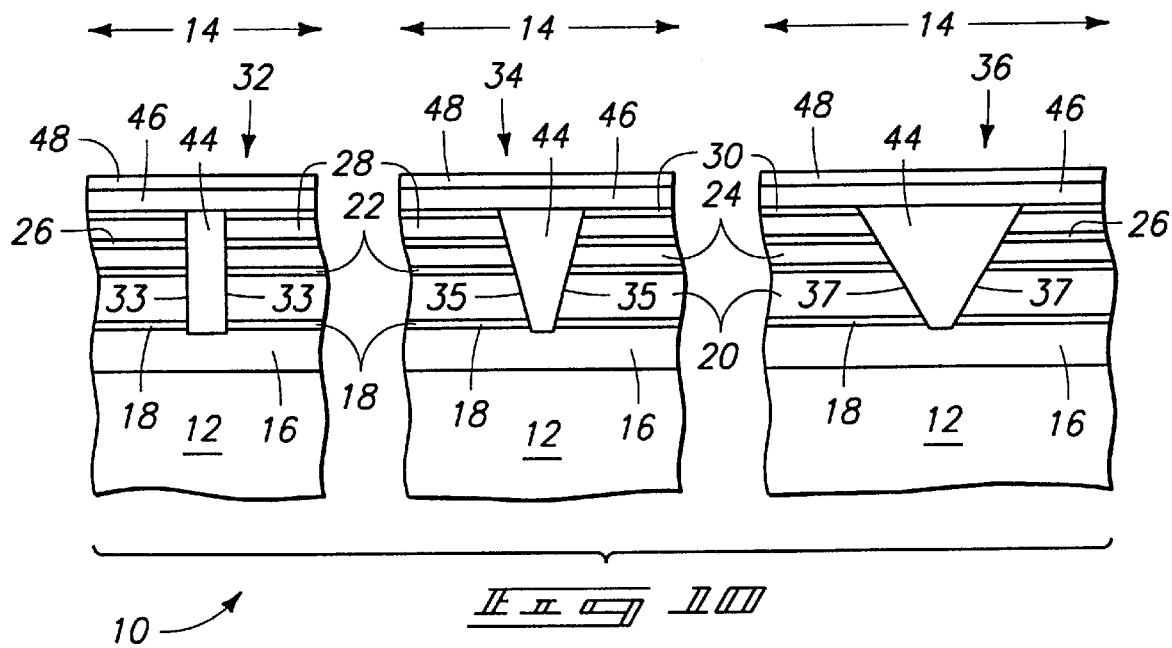
FIG. 10 is a view of the FIG. 1 wafer fragment at a processing step subsequent to that depicted by FIG. 9.

Referring to FIG. 10, a conductively doped semiconductive material layer 46 is deposited, and a silicon nitride layer 48 is deposited thereover. An example material for layer 46 is polysilicon, which is conductively doped either during or after deposition, with arsenic being but one example. By way of examples only, an exemplary thickness range for layer 46 is 75 nanometers to 125 nanometers. An exemplary thickness range for layer 48 is 20 nanometers to 50 nanometers.

Referring to FIG. 11, layers 48, 46, 30, 28 and 26 are patterned as shown.

Referring to FIG. 12, a silicon nitride layer 50 is deposited over the substrate, with an exemplary thickness range for layer 50 being from about 50 nanometers to about 100 nanometers.

Figure 13:
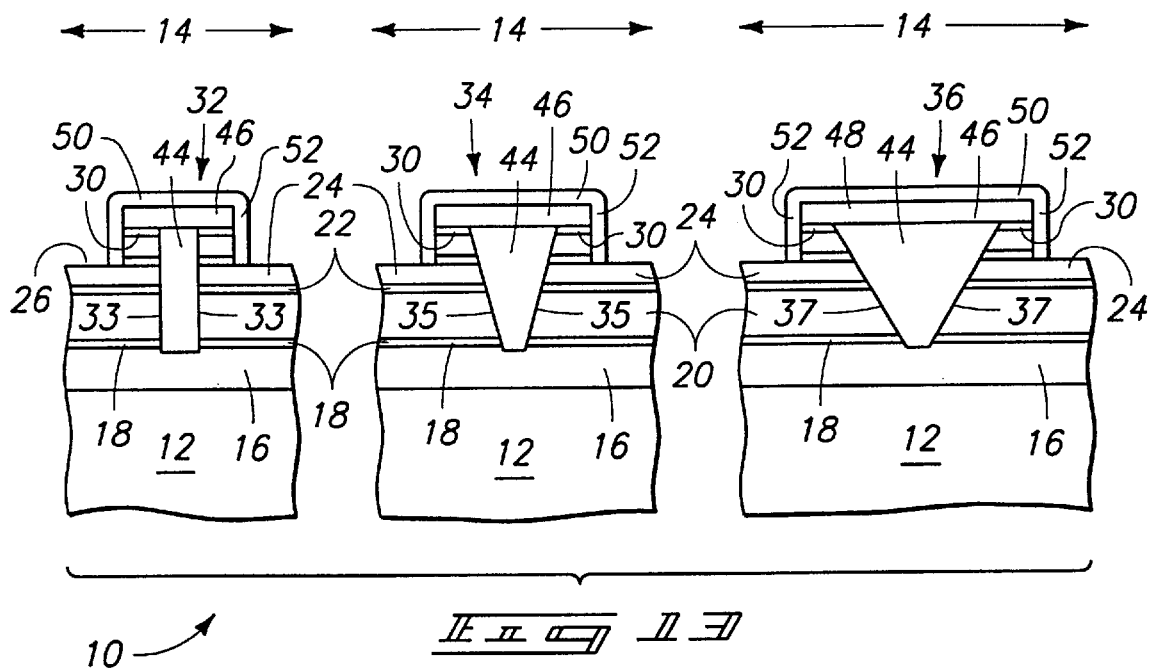
FIG. 13 is a view of the FIG. 1 wafer fragment at a processing step subsequent to that depicted by FIG. 12.

Referring to FIG. 13, layer 50 has been anisotropically etched to form insulating sidewall spacers 52 and preferably sufficiently to outwardly expose layer 24. Layer/material/ region 46 will constitute source/drain regions of the respective depicted transistors being formed, with the above depicted processing disclosing but one exemplary method of forming respective source/drain regions outwardly and operably proximate semiconductive channel material/region 44.

Figure 14:
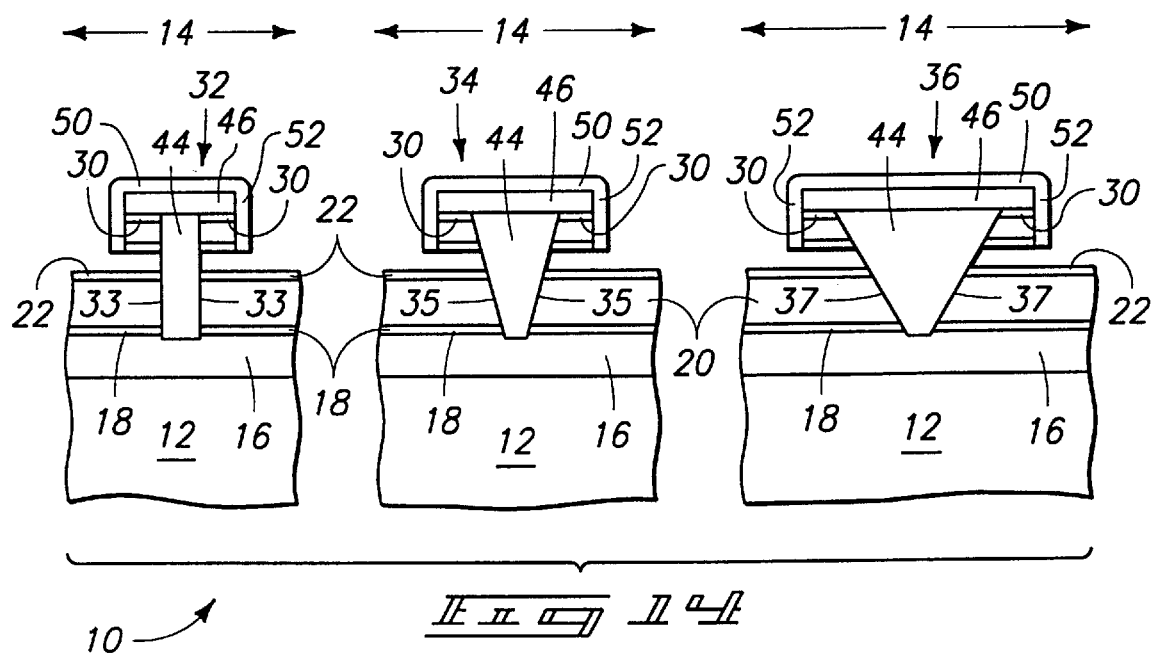
FIG. 14 is a view of the FIG. 1 wafer fragment at a processing step subsequent to that depicted by FIG. 13.

Referring to FIG. 14, at least a portion of channel defining layer 24 (and preferably all as shown) is removed to expose at least some of semiconductive channel material 44.

Figure 15:
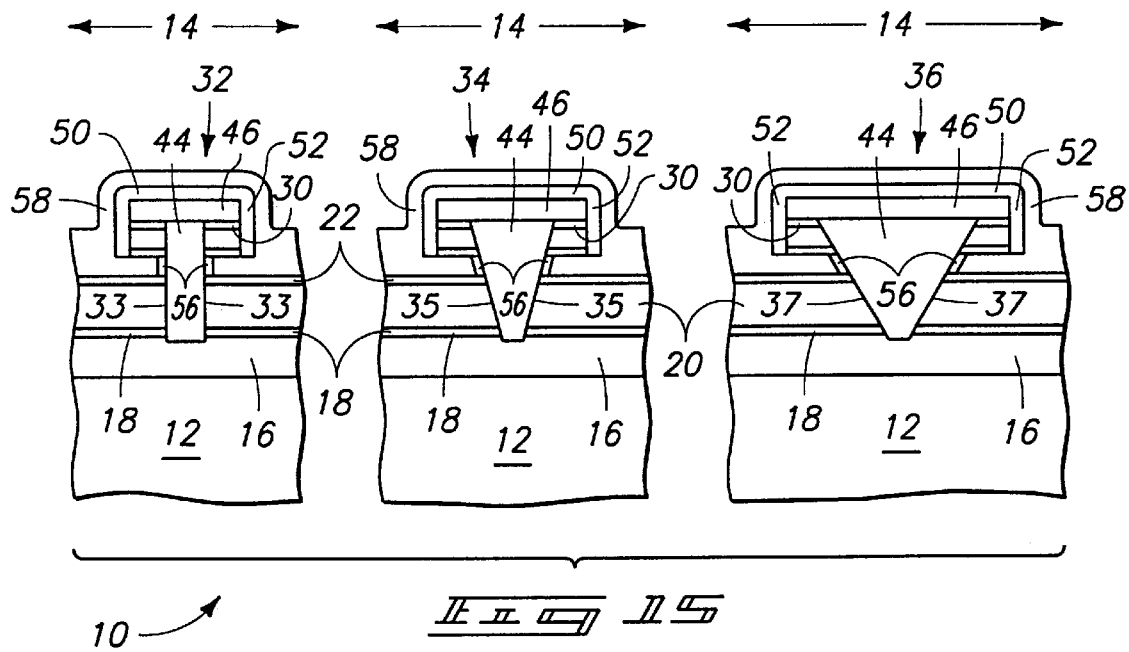
FIG. 15 is a view of the FIG. 1 wafer fragment at a processing step subsequent to that depicted by FIG. 14.

Referring to FIG. 15, respective gate dielectric layers 56 are formed over semiconductive channel material 44, for example, by oxide growth to an exemplary thickness range of from 1 nanometer to 5 nanometers. Thereafter, a suitable conductive gate material 58 is formed thereover as shown. Exemplary preferred material includes phosphorus-doped, highly conformal amorphous silicon which is subsequently crystallized, and preferably completely fills the space underneath the subject device as shown without forming voids.

Figure 16:
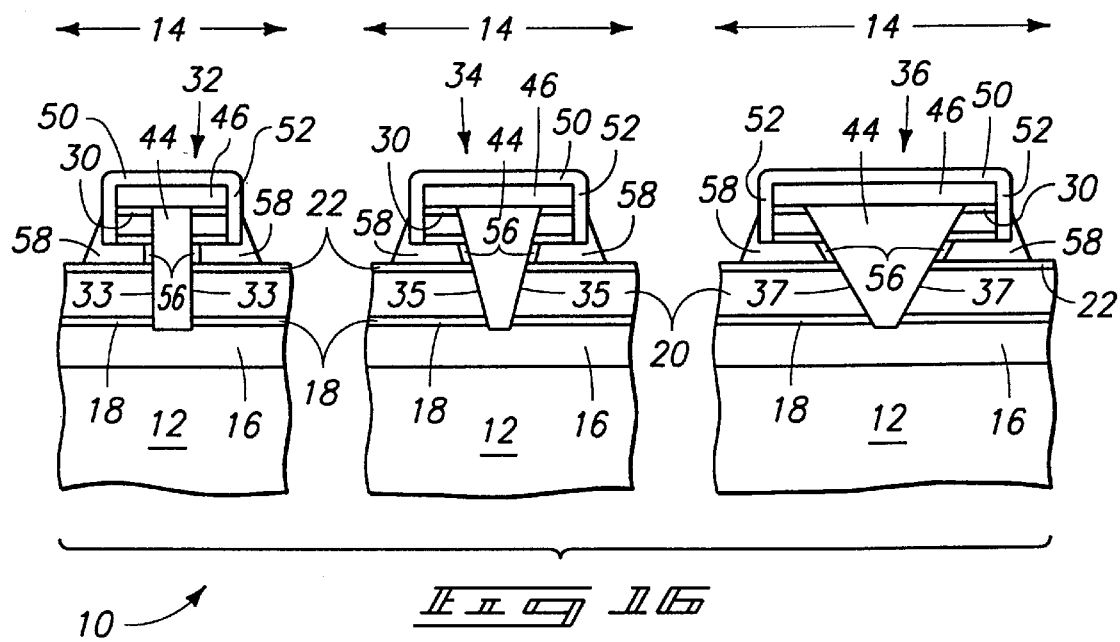
FIG. 16 is a view of the FIG. 1 wafer fragment at a processing step subsequent to that depicted by FIG. 15.

Referring to FIG. 16, the subject gates can be patterned and etched as shown.

In the above depicted and described example, channel defining layer 24 has a thickness which is selected to essentially define the gate length with respect to the field effect transistor device formed in connection with opening 32 formation, with such thickness being impacting relative to the angle gates and lengths produced for the field effect transistor devices formed in connection with openings 34 and 36. The preferred two phosphosilicate glass layers 20 and 28 preferably function as dopant sources used to form low-resistance, shallow, self-aligned source/drain extensions by solid state diffusion of phosphorus. The subject thin silicon nitride layers 22, 26 and 30 function at etch stops and as precision offset spacers.

Diffusion region 16 constitutes a respective complimentary source/drain region in connection with region 46 for the respective transistors, with region 16 in the depicted example being formed prior to forming channel defining layer 24 and prior to forming source/drain region 46.

The invention also contemplates integrated circuitry independent of any methodical aspect of formation. Such integrated circuitry, in accordance with this aspect of the invention, comprises a substrate having a mean global outer surface extending along a plane. A first field effect transistor comprises a first gate, a first gate dielectric layer, a first channel and a pair of source/drain regions. One of the first transistor source/drain regions is received elevationally inward of the first channel. The other of the first transistor source/drain regions is received elevationally outward of the first channel. The first field effect transistor has a first channel length defined along the first gate dielectric layer and has at least some portion which is substantially straight linear.

A second field effect transistor of the integrated circuitry comprises a second gate, a second gate dielectric layer, a second. channel and a pair of source/drain regions. One of the second transistor source/drain regions is received elevationally inward of the second channel. The other of the second transistor source/drain regions is received elevationally outward of the second channel. The second field effect transistor has a second channel length defined along the second gate dielectric layer, and has at least some portion which is substantially straight linear.

The first and second channel lengths have different total lengths. Both of the straight linear portions of the first and second channel lengths are angled from the plane. At least one of the straight linear portions of the first and second channel lengths is bevelled relative to the plane.

In compliance with the statute, the invention has been described in language more or less specific as to structural and methodical features. It is to be understood, however, that the invention is not limited to the specific features shown and described, since the means herein disclosed comprise preferred forms of putting the invention into effect. The invention is, therefore, claimed in any of its forms or modifications within the proper scope of the appended claims appropriately interpreted in accordance with the doctrine of equivalents.

What is claimed is:

1. Integrated circuitry comprising:
    a substrate having a mean global outer surface extending along a plane;
    a first field effect transistor comprising a first gate, a first gate dielectric layer, a first channel, and a pair of source/drain regions, one of the first transistor source/drain regions being received elevationally inward of the first channel, the other of the first transistor source/drain regions being received elevationally outward of the first channel, the first field effect transistor having a first channel length defined along the first gate dielectric layer and having at least some portion which is substantially straight linear;
    a second field effect transistor comprising a second gate, a second gate dielectric layer, a second channel, and a pair of source/drain regions, one of the second transistor source/drain regions being received elevationally inward of the second channel, the other of the second transistor source/drain regions being received elevationally outward of the second channel, the second field effect transistor having a second channel length defined along the second gate dielectric layer and having at least some portion which is substantially straight linear; and
    the first and second channel lengths having different total lengths, both of the straight linear portions of the first and second channel lengths being angled from the plane, at least one of the straight linear portions of the first and second channel lengths being beveled relative to the plane.

2. The integrated circuitry of claim 1 wherein only one of the straight linear portions of the first and second channel lengths is beveled relative to the plane.

3. The integrated circuitry of claim 1 wherein both of the straight linear portions of the first and second channel lengths are beveled relative to the plane.

4. The integrated circuitry of claim 1 wherein the substrate comprises bulk monocrystalline silicon.

5. The integrated circuitry of claim 1 wherein at least one of the first and second channels has opposing sides over both of which its respective first or second gate is received.

6. The integrated circuitry of claim 5 wherein only one of the straight linear portions of the first and second channel lengths is beveled relative to the plane.

7. The integrated circuitry of claim 5 wherein both of the straight linear portions of the first and second channel lengths are beveled relative to the plane.

8. The integrated circuitry of claim 1 wherein both of the first and second channels respectively have opposing sides over both of which its respective first or second gate is received.

9. The integrated circuitry of claim 8 wherein only one of the straight linear portions of the first and second channel lengths is beveled relative to the plane.

10. The integrated circuitry of claim 8 wherein both of the straight linear portions of the first and second channel lengths are beveled relative to the plane.

11. The integrated circuitry of claim 1 wherein the at least some portion of the first channel length along the first dielectric layer is perfectly straight linear.

12. The integrated circuitry of claim 1 wherein the at least some portion of the first channel length along the first dielectric layer is perfectly straight linear, and the at least some portion of the second channel length along the second dielectric layer is perfectly straight linear.

13. The integrated circuitry of claim 1 wherein the first and second channels have different respective maximum thicknesses.

14. The integrated circuitry of claim 1 wherein the transistor having the one straight linear portion which is beveled relative to the plane has its source/drain regions of the pair having different maximum thickness.

15. The integrated circuitry of claim 14 wherein only one of the straight linear portions of the first and second channel lengths is beveled relative to the plane.

16. The integrated circuitry of claim 1 wherein both of the straight linear portions of the first and second channel lengths are beveled relative to the plane, and wherein the source/drain regions of the first transistor have different maximum thicknesses and the source/drain regions of the second transistor have different maximum thicknesses.

* * * * *

UNITED STATES PATENT AND TRADEMARK OFFICE
CERTIFICATE OF CORRECTION

PATENT NO. : 6,548,872 B2
DATED : April 15, 2003
INVENTOR(S) : Alan R. Reinberg

It is certified that error appears in the above-identified patent and that said Letters Patent is hereby corrected as shown below:

Column 1,
Line 8, replace "patent Ser. No. 09/579,281, filed Apr. 24, 2000, entitled" with -- patent Ser. No. 09/579,281, filed May 24, 2000, entitled --

Column 5,
Line 53, replace "performed according to any a suitable method known to" with -- performed according to any suitable method known to --

Column 7,
Line 54, replace "second. channel and a pair of source/drain regions. One of" with -- second channel and a pair of source/drain regions. One of --

Signed and Sealed this

First Day of July, 2003

JAMES E. ROGAN
*Director of the United States Patent and Trademark Office*